(12) United States Patent
Himori et al.

(10) Patent No.: US 10,032,611 B2
(45) Date of Patent: Jul. 24, 2018

(54) CONNECTION CONTROL METHOD

(71) Applicant: Tokyo Electron Limited, Tokyo (JP)

(72) Inventors: Shinji Himori, Miyagi (JP); Norikazu Yamada, Miyagi (JP); Takeshi Ohse, Sendai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/391,108

(22) Filed: Dec. 27, 2016

(65) Prior Publication Data

US 2017/0110296 A1  Apr. 20, 2017

Related U.S. Application Data

(63) Continuation of application No. 13/434,989, filed on Mar. 30, 2012.

(Continued)

(30) Foreign Application Priority Data

Mar. 31, 2011  (JP) ................................ 2011-079733

(51) Int. Cl.
*H01L 21/302* (2006.01)
*H01J 37/32* (2006.01)

(52) U.S. Cl.
CPC .. *H01J 37/32697* (2013.01); *H01J 37/32165* (2013.01); *H01J 37/32366* (2013.01);

(Continued)

(58) Field of Classification Search
CPC ........... H01J 2237/327; H01J 37/32165; H01J 37/32642; H01J 37/32697;
(Continued)

(56) References Cited

U.S. PATENT DOCUMENTS 4,795,529 A  1/1989 Kawasaki
5,665,166 A  9/1997 Deguchi
(Continued)

FOREIGN PATENT DOCUMENTS

CN  1327083 A  12/2001
CN  1734712 A  2/2006
(Continued)

*Primary Examiner* — Lan Vinh
(74) *Attorney, Agent, or Firm* — Pearne & Gordon LLP

(57) ABSTRACT

A connection control method in a substrate processing apparatus is provided. The substrate processing apparatus comprises: a depressurized processing room; a susceptor that is provided in the processing room and configured to mount a wafer thereon; a HF high frequency power supply configured to apply a high frequency voltage for plasma generation to the susceptor; a LF high frequency power supply configured to apply a high frequency voltage for a bias voltage generation to the susceptor; and a DC voltage applying unit configured to apply a DC voltage of a rectangle-shaped wave to the susceptor, capable of improving a processing controllability in an etching process. The connection control method comprises controlling connection or disconnection between the susceptor and the LF high frequency power supply and connection or disconnection between the susceptor and the DC voltage applying unit when plasma is generated in the processing room.

3 Claims, 8 Drawing Sheets

Related U.S. Application Data

(60) Provisional application No. 61/477,634, filed on Apr. 21, 2011.

(52) U.S. Cl.
CPC ... *H01J 37/32642* (2013.01); *H01J 37/32724* (2013.01); *H01J 2237/327* (2013.01)

(58) Field of Classification Search
CPC ........... H01J 37/32724; H01J 37/32091; H01J 37/32366; C23C 16/5093; C23C 16/5096; C23C 16/0245
USPC ....... 438/706, 710, 714; 156/345.44, 345.45, 156/345.47, 345.48
See application file for complete search history.

(56) References Cited

U.S. PATENT DOCUMENTS

| | | |
|---|---|---|
| 6,790,766 B2 | 9/2004 | Yamaoka |
| 6,863,018 B2 | 3/2005 | Koizumi |
| 2005/0034674 A1 | 2/2005 | Ono |
| 2006/0037704 A1 | 2/2006 | Iwata |
| 2007/0029194 A1* | 2/2007 | Matsumoto ....... H01J 37/32082 204/298.31 |
| 2009/0194508 A1 | 8/2009 | Ui |
| 2009/0223933 A1* | 9/2009 | Iwata ................ H01J 37/32091 216/67 |
| 2010/0025372 A1* | 2/2010 | Tsujimoto ......... H01J 37/32091 216/71 |
| 2010/0243607 A1 | 9/2010 | Ohse et al. |
| 2014/0326409 A1 | 11/2014 | Koshiishi |

FOREIGN PATENT DOCUMENTS

| | | |
|---|---|---|
| CN | 1973363 A | 5/2007 |
| CN | 101853770 A | 10/2010 |
| JP | 08-017801 A | 1/1996 |
| JP | 08-139077 A | 5/1996 |
| JP | 2006-270019 A | 10/2006 |
| JP | 2009-004750 A | 1/2009 |
| JP | 2009-187975 A | 8/2009 |
| JP | 2010-238960 A | 10/2010 |

\* cited by examiner

CONNECTION CONTROL METHOD

CROSS-REFERENCE TO RELATED APPLICATION

This is a continuation application of U.S. patent application Ser. No. 13/434,989, filed on Mar. 30, 2012 which claims the benefit of Japanese Patent Application No. 2011-079733 filed on Mar. 31, 2011, and U.S. Provisional Application Ser. No. 61/477,634 on Apr. 21, 2011, the entire disclosures of which are incorporated herein by reference.

TECHNICAL FIELD

The present disclosure relates to a connection control method for performing a certain process on a substrate by using plasma.

BACKGROUND

A substrate processing apparatus performs a certain plasma process on a semiconductor wafer (hereinafter, referred to as simply a "wafer") serving as a substrate by using plasma. The substrate processing apparatus includes a depressurized processing chamber; a mounting table provided in the processing chamber; a HF (High Frequency) high frequency power supply configured to be connected to the mounting table and apply a high frequency voltage of a relatively high frequency (hereinafter, referred to as a "HF high frequency voltage") to a susceptor serving as the mounting table; and a LF (Low Frequency) high frequency power supply configured to be connected to the susceptor and apply a high frequency voltage of a relatively low frequency (hereinafter, referred to as a "LF high frequency voltage") to the susceptor.

A processing gas introduced into the processing chamber is excited into plasma by applying the HF high frequency voltage. A bias voltage is generated in the susceptor by applying the LF high frequency voltage. In this case, a self bias is generated in the susceptor. When an electric potential of the susceptor is time-averaged, the electric potential has a negative value. Accordingly, ions are attracted to the susceptor by the electric potential difference.

However, since the LF high frequency voltage is a sine wave, it is known that in the case where the bias voltage is generated in the susceptor by applying the LF high frequency voltage, an energy distribution of ions attracted to the susceptor has a peak value of relatively low energy and a peak value of relatively high energy, and further, has a certain range as shown in FIG. 9. (see, for example, Patent Document 1)

Patent Document 1: Japanese Patent Laid-Open Application No. 2009-187975 (FIG. 14)

However, etching by ions of relatively low energy is strongly isotropic. Etching by ions of relatively high energy is strongly anisotropic. Accordingly, if a bias voltage is generated in a susceptor by applying the LF high frequency voltage, anisotropy in etching becomes strong even when isotropy in the etching is needed. Also, isotropy in etching becomes strong even when anisotropy in the etching is needed. As a result, a desired shape of a hole or a trench may not be formed by the etching. That is, when the bias voltage is generated in the susceptor by using the LF high frequency voltage, processing controllability in an etching process is not so good.

The present illustrative embodiments provide a substrate processing apparatus capable of improving the processing controllability in the etching process.

SUMMARY

In order to achieve the present object, in accordance with one aspect of an illustrative embodiment, there is provided a substrate processing apparatus including a depressurized processing room; a mounting table that is provided in the processing room and configured to mount a substrate thereon; a first high frequency power supply configured to apply a high frequency voltage of a relatively high frequency; a second high frequency power supply configured to apply a high frequency voltage of a relatively low frequency to the mounting table; and a DC voltage applying unit configured to apply a DC voltage of a rectangle-shaped wave to the mounting table.

The substrate processing apparatus may further include a connection changeover switch configured to connect or disconnect the DC voltage applying unit to or from the second high frequency power supply and the mounting table.

In accordance with another aspect of an illustrative embodiment, there is provided a connection control method in a substrate processing apparatus comprising: a depressurized processing room; a mounting table that is provided in the processing room and configured to mount a substrate thereon; a first high frequency power supply configured to apply a high frequency voltage for plasma generation; a second high frequency power supply configured to apply a high frequency voltage for bias voltage generation to the mounting table; and a DC voltage applying unit configured to apply a DC voltage of a rectangle-shaped wave to the mounting table. The connection control method comprises controlling connection or disconnection between the mounting table and the second high frequency power supply and connection or disconnection between the mounting table and the DC voltage applying unit, when plasma is generated in the processing room.

In the step of controlling, the connection or the disconnection between the mounting table and the second high frequency power supply and the connection or the disconnection between the mounting table and the DC voltage applying unit may be controlled individually.

In the step of controlling, the second high frequency power supply may be disconnected from the mounting table if the DC voltage applying unit is connected to the mounting table, and the DC voltage applying unit may be disconnected from the mounting table if the second high frequency power supply is connected to the mounting table.

In accordance with the illustrative embodiments, a second high frequency power supply applies a high frequency voltage of a relatively low frequency to the mounting table. A DC voltage applying unit applies a DC voltage of a rectangle-shaped wave to the mounting table. If a bias voltage is generated on the mounting table by applying the high frequency voltage of the relatively low frequency to the mounting table, it is possible to obtain an ion energy distribution, formed in a certain range, having a peak of relatively low energy and a peak of relatively high energy. If the bias voltage is generated on the mounting table by applying the DC voltage of the rectangle-shaped wave to the mounting table, the ion energy distribution is locally formed and has only one peak. The intensity of anisotropy and the intensity of isotropy in the etching process vary depending on positions or the number of peaks in the ion energy distribution. Accordingly, by adjusting a ratio of an output value from the second high frequency power supply to an output value from the DC voltage applying unit, the intensity of anisotropy and the intensity of isotropy in the etching process can be controlled. As a result, the processing controllability in the etching process can be improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 7(A) illustrates a modified illustrative embodiment, and FIG. 7(B) illustrates another modified illustrative embodiment;

DETAILED DESCRIPTION

Hereinafter, illustrative embodiments will be described with reference to the accompanying drawings.

Figure 1:
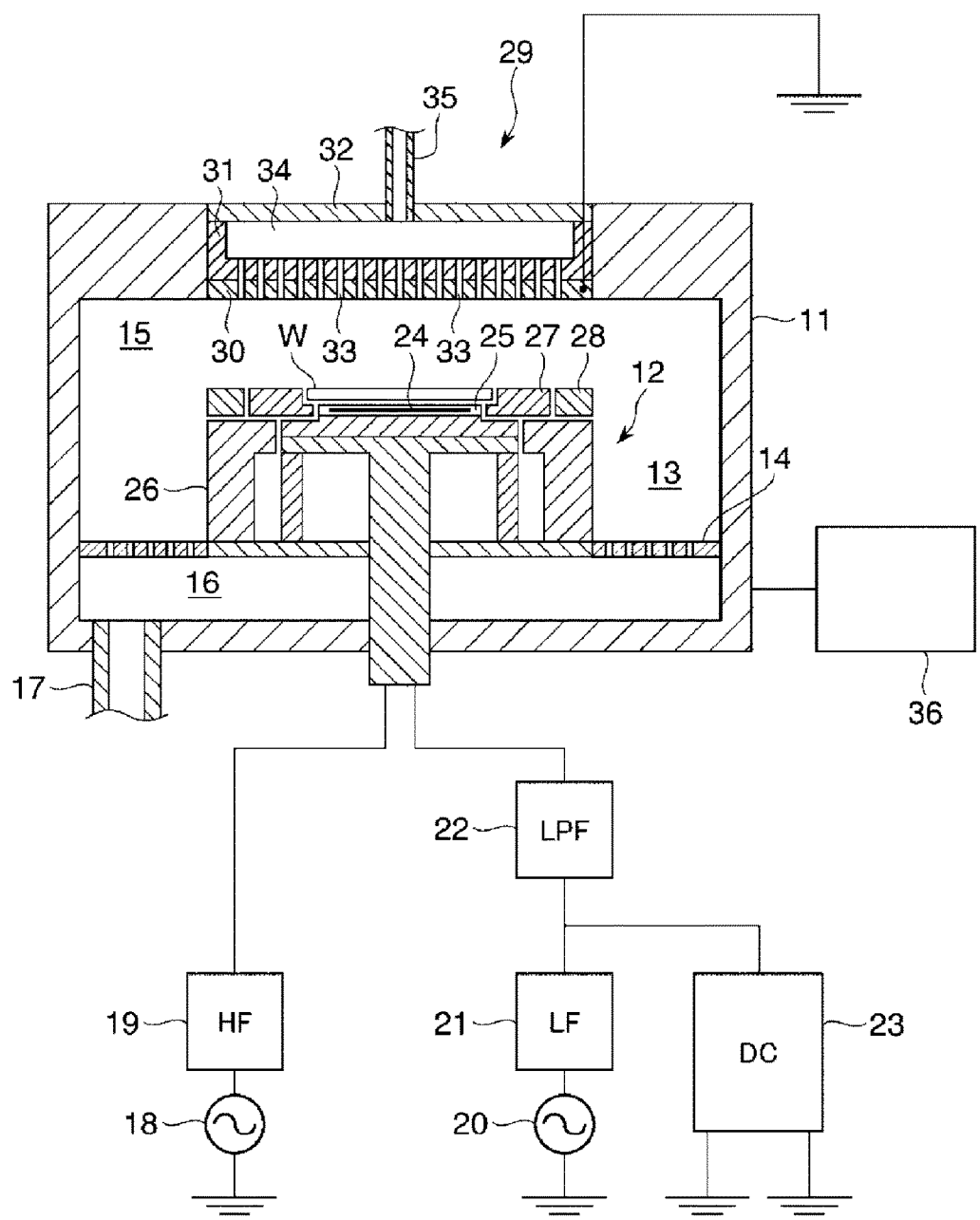
FIG. 1 is a schematic cross-sectional view showing configuration of a substrate processing apparatus in accordance with an illustrative embodiment.

FIG. 1 is a schematic configuration view of a substrate processing apparatus in accordance with an illustrative embodiment. In the substrate processing apparatus, a plasma etching process is performed on a semiconductor device wafer (hereinafter, simply referred to as a "wafer") as a substrate.

In FIG. 1, a substrate processing apparatus 10 includes a chamber 11 for accommodating a wafer W having a diameter of, e.g., about 300 mm, and a circular column-shaped susceptor 12 (mounting table) for mounting there on the wafer W is provided within the chamber 11. In the substrate processing apparatus 10, a side exhaust path 13 is formed between an inner sidewall of the chamber 11 and a side surface of the susceptor 12. An exhaust plate 14 is provided at a certain portion of the side exhaust path 13.

The exhaust plate 14 is a plate-shaped member having a multiple number of through holes, and the exhaust plate 14 serves as a partition plate that divides the chamber 11 into an upper part and a lower part. As will be described later, plasma is generated in an inner space of the upper part 15 (hereinafter, referred to as "processing room") of the chamber 11. Further, an exhaust pipe 17 for exhausting a gas within the chamber 11 is connected to the lower portion 16 (hereinafter, referred to as "exhaust room (manifold)") of the chamber 11. The exhaust plate 14 confines or reflects the plasma generated within the processing room 15 so as to prevent leakage of the plasma into the manifold 16.

A TMP (Turbo Molecular Pump) and a DP (Dry Pump) (both not shown) are connected to the exhaust pipe 17, and these pumps evacuate and depressurize the inside of the chamber 11. To be specific, the DP depressurizes the inside of the chamber 11 to an intermediate vacuum state from an atmospheric pressure. Further, in cooperation with the DP, the TMP depressurizes the inside of the chamber 11 to a high vacuum state lower than the intermediate vacuum state. Further, an internal pressure of the chamber 11 is controlled by an APC valve (not shown).

A HF high frequency power supply 18 (first high frequency power supply) is connected to the susceptor 12 in the chamber 11 via a HF matching unit 19. The HF high frequency power supply 18 applies a high frequency voltage having a relatively high frequency (hereinafter, referred to as a "high frequency voltage for plasma generation"), e.g., about 40 MHz to about 300 MHz to the susceptor 12. Further, a LF high frequency power supply 20 (second high frequency power supply) is connected to the susceptor 12 via an LF matching unit 21 and a low pass filter 22. The LF high frequency power supply 20 applies a high frequency voltage having a relatively low frequency (hereinafter, referred to as a "high frequency voltage for bias voltage generation"), e.g., about 380 KHz to about 20 MHz to the susceptor 12. A DC voltage applying unit 23 is connected to the susceptor 12 via the low pass filter 22. The DC voltage applying unit 23 applies a DC voltage of a rectangle-shaped wave to the susceptor 12 as described later. The susceptor 12, where the high frequency voltage and the DC voltage are applied, serves as a lower electrode. In the substrate processing apparatus 10, a wiring from the HF high frequency power supply 18 to the susceptor 12 and a wiring from the low pass filter 22 to the susceptor 12 do not intersect with each other. Thus, the low pass filter 22 is provided between the HF high frequency power supply 18 and the LF high frequency power supply 20, and between the HF high frequency power supply 18 and the DC voltage applying unit 23, in terms of the electric circuit.

The HF matching unit 19 matches impedance between plasma and the HF high frequency power supply 18 so that applying efficiency of the high frequency voltage for plasma generation to the susceptor 12 is improved. The LF matching unit 21 matches impedance between plasma and the LF high frequency power supply 20 so that applying efficiency of the high frequency voltage for bias voltage generation to the susceptor 12 is improved. The low pass filter 22 blocks the high frequency voltage for plasma generation so as to prevent the high frequency voltage for plasma generation from being introduced into the LF high frequency power supply 20 and the DC voltage applying unit 23.

A processing gas is excited by applying the high frequency voltage for plasma generation to the susceptor 12, and plasma is generated in the processing room 15, as described later. A bias voltage is generated in the susceptor 12 by applying the high frequency voltage for bias voltage generation and the DC voltage of the rectangle-shaped wave to the susceptor 12. As described above, since the bias voltage in the susceptor 12 varies in a negative range, ions of the plasma are attracted to the susceptor 12 by the electric potential difference.

A step-shaped portion is formed in an upper peripheral portion of the susceptor 12 such that a center portion of the susceptor 12 protrudes upward in the drawing. A plate-shaped electrostatic chuck 25, made of ceramics, having an electrostatic electrode plate 24 therein is provided on the central portion of the susceptor 12. The electrostatic electrode plate 24 is connected with a DC power supply (not illustrated). When a positive DC voltage is applied to the electrostatic electrode plate 24, a negative potential is generated on a bottom surface (hereinafter, referred to as a "rear surface") of the wafer facing the electrostatic chuck 25. As a result, the electric potential difference is generated between the electrostatic electrode plate 24 and the rear surface of the wafer W. The wafer W is attracted to and held on the electrostatic chuck 25 by a Coulomb force or a Johnsen-Rahbek force generated by the electric potential difference.

The susceptor 12 includes therein a cooling unit (not shown) formed of a coolant path. The cooling unit absorbs heat of the wafer W, of which temperature can be increased by being in contact with plasma, via the susceptor 12. Therefore, it is possible to prevent a temperature of the wafer W from being increased higher than a desired level.

The susceptor 12 is made of a conductor such as aluminum in consideration of the heat transfer efficiency and a function as an electrode. However, in order to prevent the conductor from being exposed to the processing room 15 where plasma is generated, a side surface of the susceptor 12 is covered with a side surface protection member 26 made of a dielectric material such as quartz ($SiO_2$).

Further, an annular focus ring 27 is mounted on the step-shaped portion in the upper portion of the susceptor 12 and the side surface protection member 26 so as to surround the wafer W held on the electrostatic chuck 25. Furthermore, a shield ring 28 is provided on the side surface protection member 26 so as to surround the focus ring 27. The focus ring 27 is made of silicon (Si) or silicon carbide (SiC). Accordingly, the plasma is distributed above the wafer W and the focus ring 27.

A shower head 29 is provided at a ceiling of the chamber 11 so as to face the susceptor 12. The shower head 29 includes an upper electrode plate 30 (facing electrode) formed of a conductor having its surface covered with an insulating film or a simple substance semiconductor, e.g., silicon; a cooling plate 31 supporting the upper electrode plate 30 in a detachable manner; and a cover 32 covering the cooling plate 31. The upper electrode plate 30 is a plate-shaped member having a multiple number of gas holes 33 formed through the upper electrode plate 30 in the thickness direction, and the upper electrode plate 30 is electrically grounded. Therefore, an electric potential of the upper electrode plate 30 is a ground potential. A buffer room 34 is formed in the cooling plate 31. A processing gas inlet line 35 is connected to the buffer room 34.

The substrate processing apparatus 10 further includes a control unit 36. The control unit 36 controls operation of each component according to a program stored in an internal memory so as to perform a plasma etching process. To be Specific, the control unit 36 controls an operation of each component, so that a processing gas supplied to the buffer room 34 from the processing gas inlet line 35 is introduced to the inner space of the processing room 15; the introduced processing gas is excited into plasma with the high frequency power for plasma generation applied to the inner space of the processing room 15 from the HF high frequency power supply 18; ions or radicals of the plasma are attracted toward the wafer W with the bias voltage generated in the susceptor 12 from the LF high frequency power supply 20 and the DC voltage applying unit 23; and a plasma etching process is performed to the wafer W.

Figure 2:
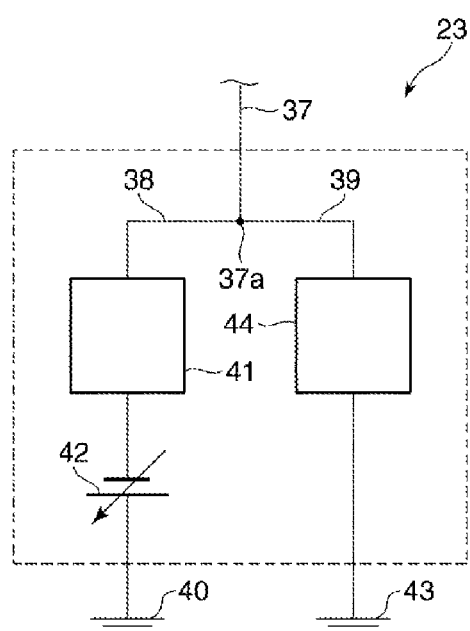
FIG. 2 is a schematic view of electric circuit of a DC voltage applying unit in FIG. 1.

FIG. 2 is a schematic view of an electric circuit of the DC voltage applying unit in FIG. 1.

In FIG. 2, the DC voltage applying unit 23 has a first and second ground wirings 38, 39 branched from the wiring 37 connected to the low pass filter 22. The first ground wiring 38 has a switching device 41 including, for example, a FET (field effect transistor), and a DC power supply 42 in this order from a branch point 37a of the wiring 37 and a ground 40. The second ground wiring 39 has a switching device 44 including, for example, FET, between the branch point 37a and a ground 43.

Figure 3:
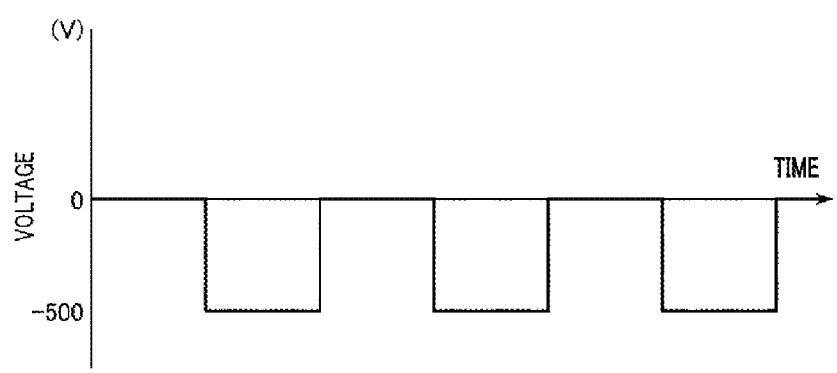
FIG. 3 is an explanatory view illustrating a DC voltage of a rectangle-shaped wave applied by the DC voltage applying unit in FIG. 1.

In the DC voltage applying unit 23, the switching devices 41, 44 are synchronized with each other to be alternatively ON/OFF. Specifically, when the switching device 41 becomes ON, the switching device 44 becomes OFF. When the switching device 44 becomes ON, the switching device 41 becomes OFF. As a result, the DC voltage applied from the DC voltage applying unit 23 shows a rectangle-shaped wave as illustrated in FIG. 3. Here, since a cathode of the DC power supply 42 is connected to the ground wiring 38 at the branch point 37a, the DC voltage applied from the DC voltage applying unit 23 shows a rectangle-shaped wave having a certain negative electric potential. The rectangle-shaped wave has about −500 V and a ground potential, alternately. In the substrate processing apparatus 10, the DC voltage applying unit 23 controls the ON/OFF timing of the switching devices 41, 44 to apply the DC voltage of the rectangle-shaped wave having a frequency equal to or smaller than 3 MHz to the susceptor 12.

However, when the high frequency voltage for bias voltage generation is applied from the LF high frequency power supply 20 to the susceptor 12, the bias voltage is generated in the susceptor 12. However, since the susceptor 12 is charged with a negative electric potential as described above, the bias voltage varies in the negative range. Ions of the plasma are attracted to the susceptor 12 by the electric potential difference from the negative bias voltage. In this case, since acceleration velocity of the ions varies depending on the electric potential difference, energy of the ions attracted to the susceptor 12 also varies depending on the electric potential difference from the bias voltage.

Here, since the high frequency voltage for bias voltage generation applied from the LF high frequency power supply 20 shows a sine wave, the bias voltage also shows a sine wave. In the variation of the voltage showing the sine wave, times during which the voltage stays near a minimum voltage and a maximum voltage become long. Accordingly, a time during which the electric potential difference between the ions and the bias voltage is maximum becomes long, and a time during which the electric potential difference is minimum also becomes long. As a result, a time during which the energy of the ions attracted to the susceptor 12 is maximum becomes long, and a time during which the energy of the ions is minimum becomes long. Accordingly, as presented by a dashed line in the graph of FIG. 4, in the ion energy distribution, a peak near a maximum value and a peak near a minimum value are formed. Since the bias voltage gradually varies between the maximum value and the minimum value of the sine wave, the electric potential difference between the ions and the bias voltage also gradually varies. As a result, the energy of the ions gradually also varies between the maximum value and the minimum value.

Figure 4:
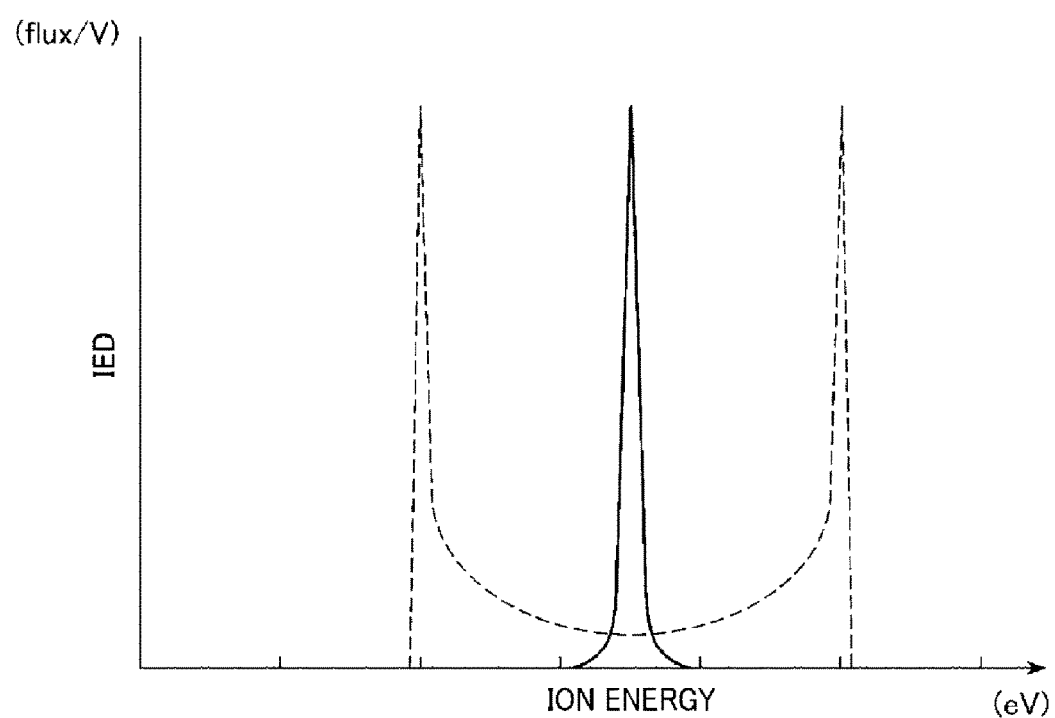
FIG. 4 is a graph for showing an energy distribution of ions attracted to a susceptor in FIG. 1.

As presented by the dashed line in FIG. 4, the energy of the ions is distributed over a range between the maximum value and the minimum value.

When the DC voltage is applied from the DC voltage applying unit 23 to the susceptor 12, the bias voltage varying in the negative range is generated in the susceptor 12. However, since the DC voltage shows the rectangle-shaped wave, the bias voltage also shows the rectangular-shaped wave. In this case, since the bias voltage shows the rectangle-shaped wave, there are only a maximum value and a minimum value in the bias voltage. However, if an electric potential of the maximum value in the bias voltage is controlled to be the same as the electric potential of the ions, the ions are affected only by the electric potential difference from the minimum value of the bias voltage. As a result, in the energy distribution of the ions attracted to the susceptor 12, there is only a peak corresponding to the electric potential difference from the minimum value of the bias voltage, as presented by a solid line in the graph of FIG. 4. That is, when the DC voltage is applied from the DC voltage applying unit 23 to the susceptor 12, the energy distribution of ions attracted to the susceptor 12 has only one peak. Further, the energy distribution is locally formed in a narrow range.

In the illustrative embodiment, applying the high frequency voltage for bias voltage generation from the LF high frequency power supply 20 and applying the DC voltage from the DC voltage applying unit 23 are separately performed depending on a type of the plasma etching process. Specifically, a ratio of an output value from the LF high frequency power supply 20 to an output value from the DC voltage applying unit 23 is adjusted depending on the type of the plasma etching process. For example, compared to the DC voltage, the high frequency voltage can easily reach a high voltage value. Accordingly, by increasing the electric potential difference between the bias voltage and the ions, etching by ions with high energy can be performed. Thus, if a proportion of the output value from the LF high frequency power supply 20 is increased, it is possible to etch a material difficult to be etched with ions having high energy.

If a proportion of the output value from the DC voltage applying unit 23 is increased, the ion energy distribution is formed in a narrow range and has only one peak. Thus, it is possible to prevent the isotropic etching and the anisotropic etching from being performed together. By changing the minimum value of the bias voltage, the position of the peak in the ion energy distribution can be changed. Thus, it is possible to allow one of the anisotropy and the isotropy to be mainly performed in the plasma etching process.

In accordance with the substrate processing apparatus 10 of the illustrative embodiment, the LF high frequency power supply 20 applies the high frequency voltage for bias voltage generation of the sine-shaped wave to the susceptor 12. The DC voltage applying unit 23 applies the DC voltage of the rectangle-shaped wave to the susceptor 12. When the bias voltage is generated in the susceptor 12 by applying the high frequency voltage for bias voltage generation to the susceptor 12, it is possible to obtain the ion energy distribution formed over the range between the maximum value and the minimum value and the ion energy distribution having a peak near the minimum value and a peak near the maximum value can be obtained. Meanwhile, when the bias voltage is generated in the susceptor 12 by applying the DC voltage of the rectangle-shaped wave to the susceptor 12, the ion energy distribution is locally formed and has only one peak. The intensity of the anisotropy and the intensity of the isotropy in the etching process vary depending on positions or the number of the peaks in the ion energy distribution. Thus, by adjusting the ratio of the output value from the LF high frequency power supply 20 to the output value from the DC voltage applying unit 23, it is possible to control the intensity of the anisotropy and the intensity of the isotropy in the etching process. As a result, the processing controllability in the etching process can be improved.

In the above-described substrate processing apparatus 10, the low pass filter 22 is provided between the HF high frequency power supply 18 and the LF high frequency power supply 20, and between the HF high frequency power supply 18 and the DC voltage applying unit 23. Thus, the low pass filter 22 prevents the high frequency voltage for plasma generation applied from the HF high frequency power supply 18 from being introduced into the LF high frequency power supply 20 and the DC voltage applying unit 23. As a result, the LF high frequency power supply 20 and the DC voltage applying unit 23 are prevented from being damaged by the high frequency voltage for plasma generation. Further, the LF high frequency power supply 20 and the DC voltage applying unit 23 can share the low pass filter 22. Accordingly, the electric circuit configuration in the substrate processing apparatus 10 can be simplified.

Figure 5:
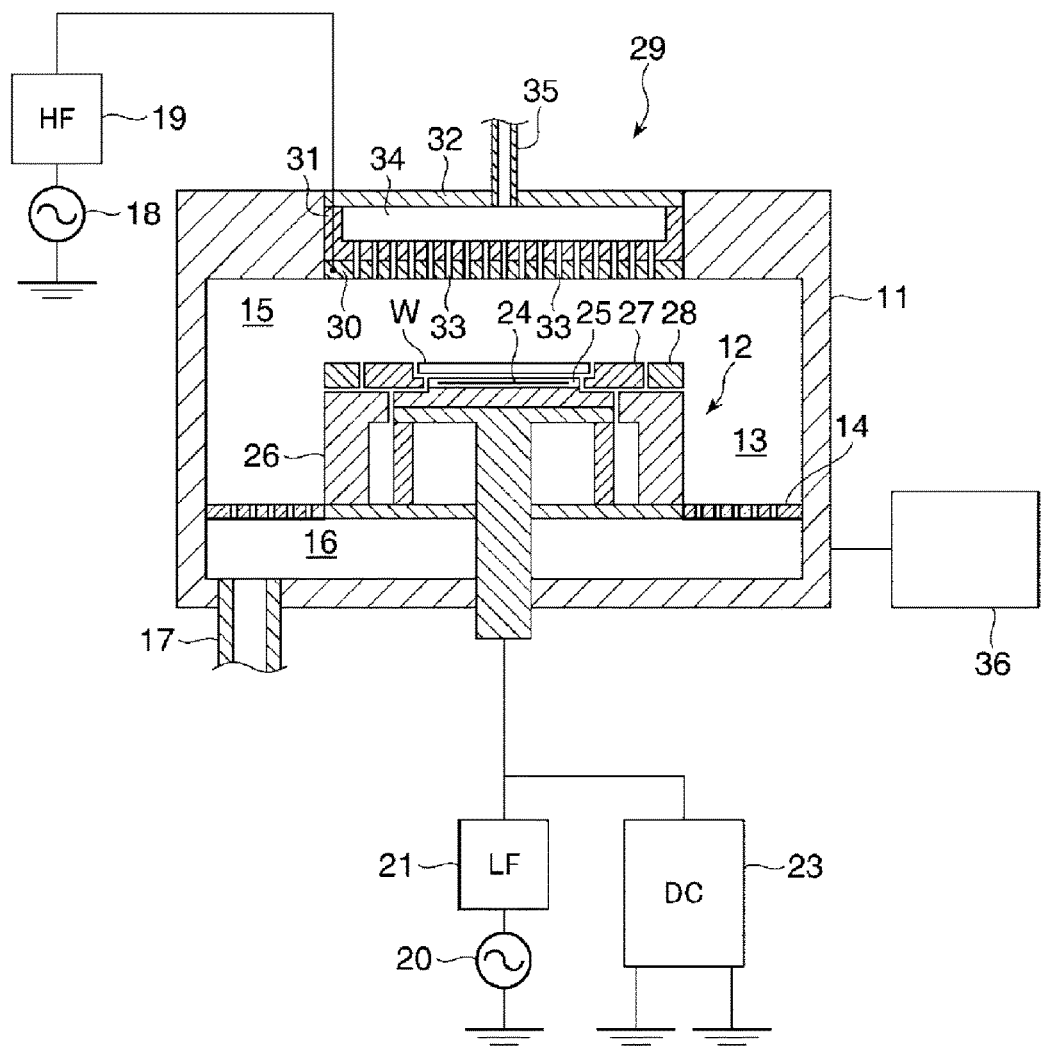
FIG. 5 is a schematic cross-sectional view showing configuration of a modified example of the substrate processing apparatus of FIG. 1.

FIG. 5 is a cross sectional view schematically showing configuration of a modified example of the substrate processing apparatus in FIG. 1.

In the substrate processing apparatus 45 of FIG. 5, the HF high frequency power supply 18 is connected to an upper electrode plate 30, instead of the susceptor 12, via the HF matching unit 19. The LF high frequency power supply 20 is connected to the susceptor 12 only via the LF matching unit 21. The DC voltage applying unit 23 is directly connected to the susceptor 12. The other configuration of the substrate processing apparatus 45 is the same as that of the substrate processing apparatus 10. In FIG. 5, components and parts corresponding to those of the substrate processing apparatus 10 are denoted with the same reference numerals as shown in the substrate processing apparatus 10.

In the substrate processing apparatus 45, the HF high frequency power supply 18 is not connected to the susceptor 12. Thus, the high frequency voltage for plasma generation applied from the HF high frequency power supply 18 is not introduced into the LF high frequency power supply 20 and the DC voltage applying unit 23 via the susceptor 12. Accordingly, in the substrate processing apparatus 45, it is not necessary to provide the low pass filter 22 between the susceptor 12 and the LF high frequency power supply 20 and between the susceptor 12 and the DC voltage applying unit 23. As a result, the electric circuit in the substrate processing apparatus 45 can be simplified.

Now, a substrate processing apparatus in accordance with a second illustrative embodiment will be described.

Figure 6:
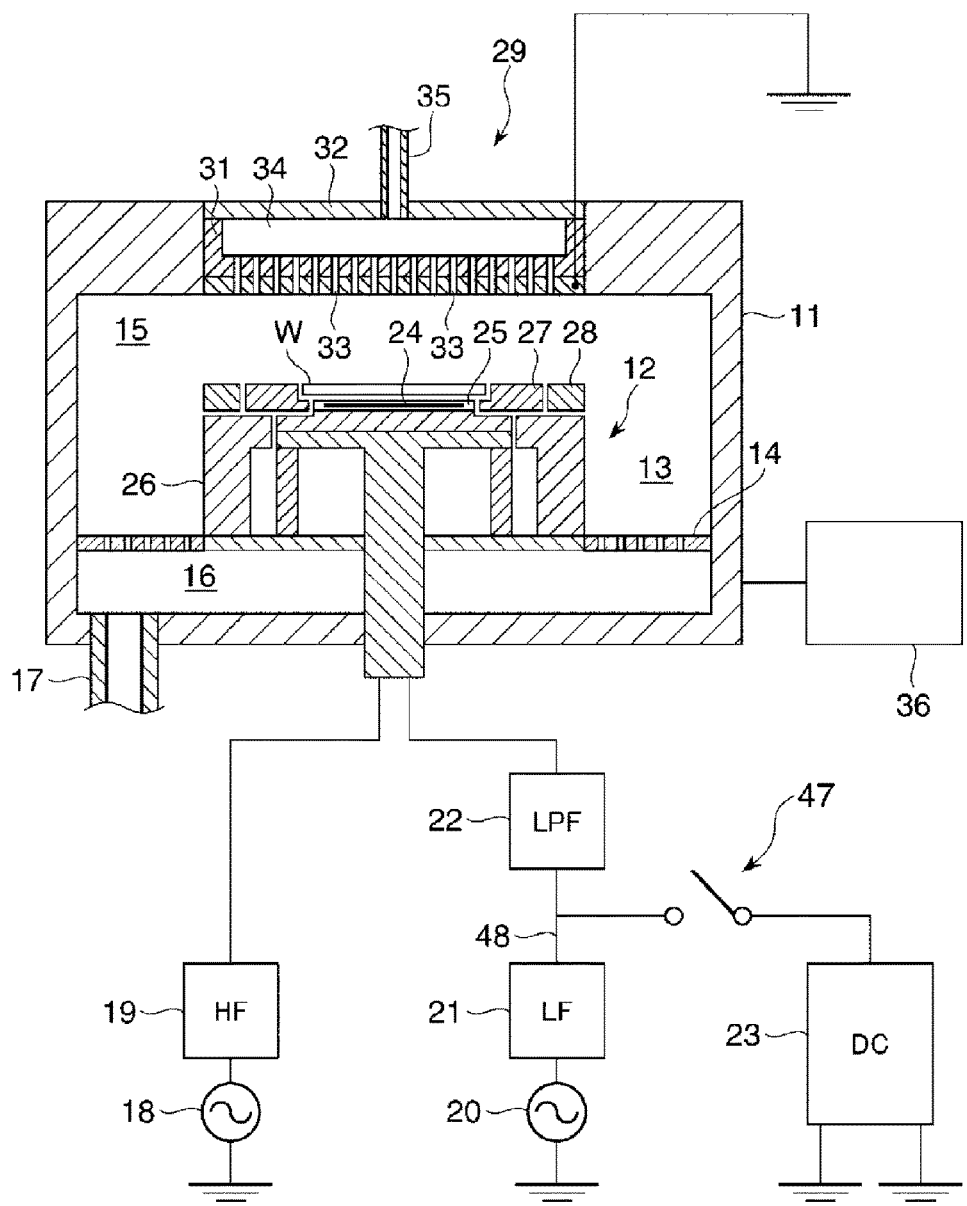
FIG. 6 is a schematic cross sectional view showing configuration of a substrate processing apparatus in accordance with a second illustrative embodiment.

FIG. 6 is a cross-sectional view schematically showing configuration of a substrate processing apparatus in accordance with the illustrative embodiment.

The configuration of the substrate processing apparatus 46 in accordance with the illustrative embodiment is the same as that of the substrate processing apparatus 10 in FIG. 1, except for a connection changeover switch 47 described below. In FIG. 6, components and parts corresponding to those of the substrate processing apparatus 10 are denoted with the same reference numerals as shown in the substrate processing apparatus 10.

In the above-described substrate processing apparatus 10 in FIG. 1, the DC voltage applying unit 23 is connected to the susceptor 12. However, in the DC voltage applying unit 23, the wiring 37 connected to the low pass filter 22 is grounded through the first and second ground wirings 38 and 39. Accordingly, when the DC voltage applying unit 23 is continuously connected to the susceptor 12, the electric potential of the susceptor 12 becomes close to the ground potential, and the electric potential difference between the electrically floating wafer W and the susceptor 12 is increased. As a result, an abnormal electric discharge may occur between the wafer W and the susceptor 12.

Further, in the substrate processing apparatus 10, the DC voltage applying unit 23 is connected to the LF high frequency power supply 20 via the LF matching unit 21. Thus, the high frequency voltage for bias voltage generation applied from the LF high frequency power supply 20 can be introduced into the DC voltage applying unit 23. The switching devices 41 and 44 in the DC voltage applying unit 23 can be damaged by a high load caused by the high frequency voltage for bias voltage generation.

The substrate processing apparatus 46 of FIG. 6 includes a connection changeover switch 47 provided between a wiring 48 connecting the low pass filter 22 with the LF matching unit 21 and the DC voltage applying unit 23. The connection changeover switch 47 includes an opening/closing member. The DC voltage applying unit 23 can be connected to and disconnected from the LF high frequency power supply 20 and the susceptor 12 by the connection changeover switch 47. During a plasma etching process, which does not require applying the DC voltage from the DC voltage applying unit 23, e.g., an etching process by ions with high energy, the DC voltage applying unit 23 is disconnected from the LF high frequency power supply 20 and the susceptor 12. During a plasma etching process, which requires allowing only one of the anisotropy and the isotropy to be strong, the LF high frequency power supply 20 and the susceptor 12 are connected to the DC voltage applying unit 23.

In the substrate processing apparatus 46, the DC voltage applying unit 23 is separated from the susceptor 12 if necessary. In such case, it is possible to prevent the susceptor 12 from being close to the ground potential via the DC voltage applying unit 23. Therefore, it is possible to prevent an abnormal electric discharge caused by the increase of the electric potential difference between the susceptor 12 and the wafer W. Furthermore, the DC voltage applying unit 23 is separated from the LF high frequency power supply 20 if necessary. In such case, it is possible to prevent the high frequency voltage for bias voltage generation from the LF high frequency power supply 20 from being introduced into the DC voltage applying unit 23. As a result, the switching devices 41 and 44 in the DC voltage applying unit 23 are prevented from being damaged.

Figure 7A:
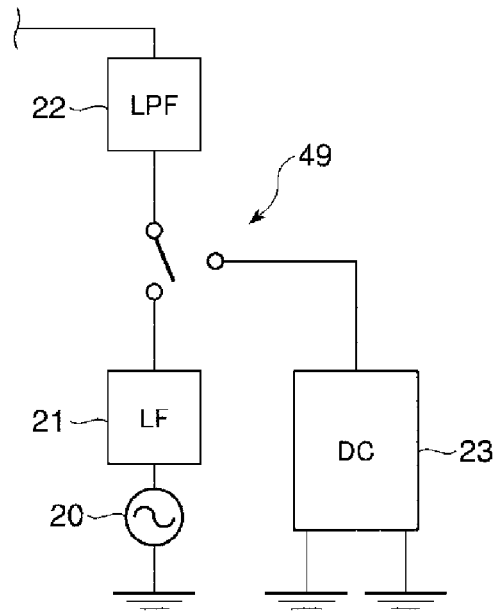
FIGS. 7(A) and 7(B) illustrate a modified example of a connection changeover switch in FIG. 6.
Figure 7B:
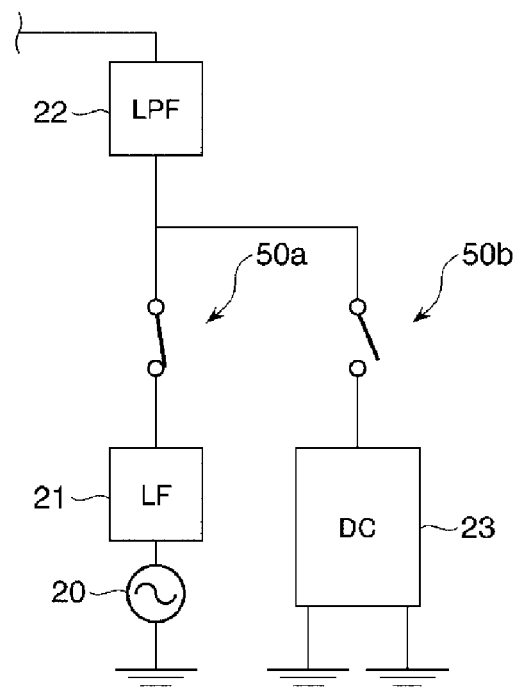

In the substrate processing apparatus 46 of FIG. 6, the connection changeover switch 47 is provided between the wiring 48 and the DC voltage applying unit 23. However, the arrangement position of the connection changeover switch is not limited thereto. For example, as illustrated in FIG. 7(A), the substrate processing apparatus 46 may include a connection changeover switch 49 provided between the low pass filter 22 and the LF matching unit 21 and between the low pass filter 22 and the DC voltage applying unit 23. As a result, the connection changeover switch 49 may select one of connection between the low pass filter 22 and the LF high frequency power supply 20 via the LF matching unit 21, and connection between the low pass filter 22 and the DC voltage applying unit 23. As illustrated in FIG. 7(B), the substrate processing apparatus 46 may include connection changeover switches 50a and 50b. The connection changeover switch 50a is provided between the low pass filter 22 and the LF matching unit 21 to control connection/disconnection between the low pass filter 22 and the LF high frequency power supply 20 via the LF matching unit 21. Further, the connection changeover switch 50b is provided between the low pass filter 22 and the DC voltage applying unit 23 to control connection/disconnection between the low pass filter 22 and the DC voltage applying unit 23.

Figure 8:
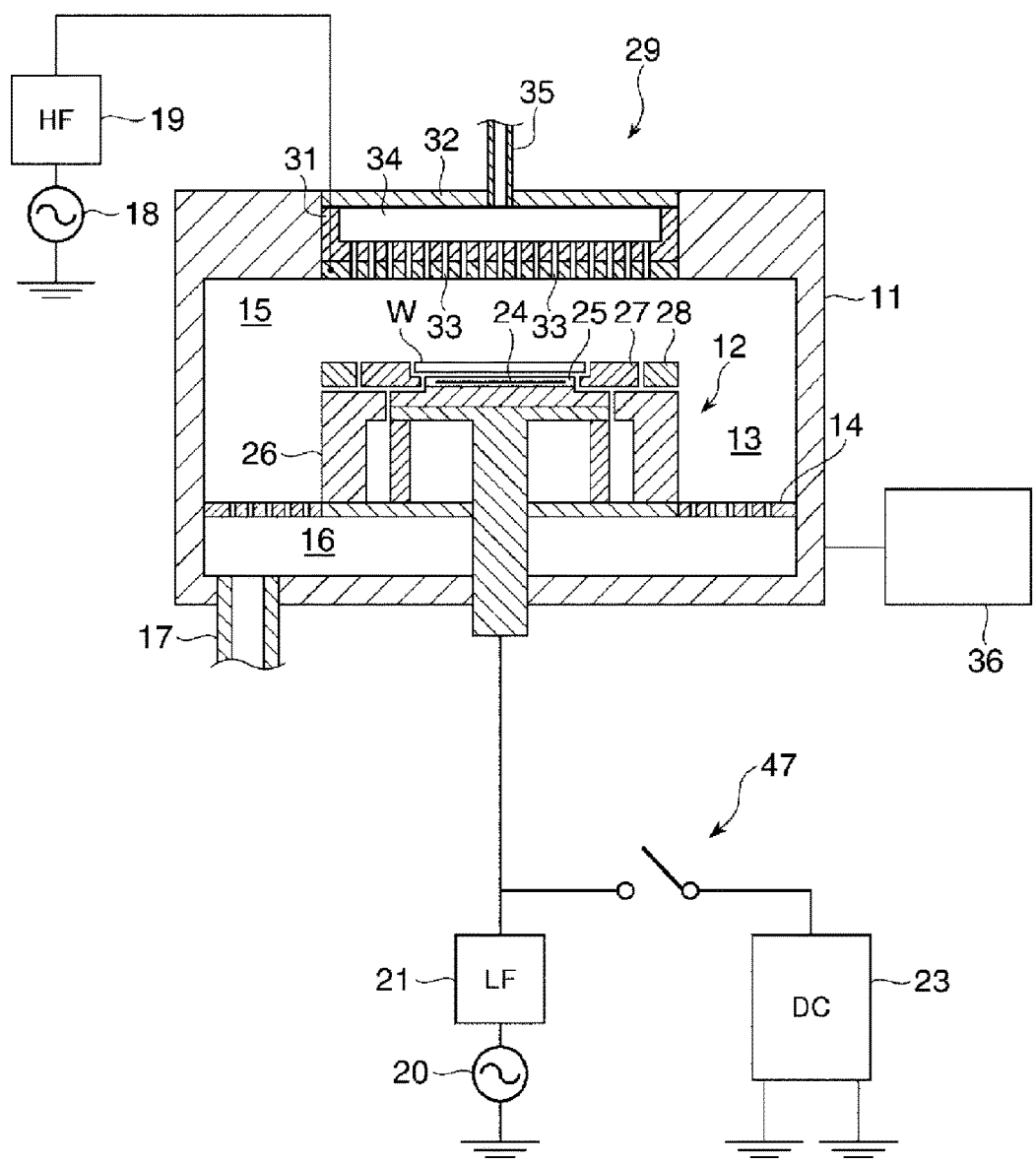
FIG. 8 is a cross-sectional view schematically showing configuration of a modified example of the substrate processing apparatus in FIG. 6.
Figure 9:
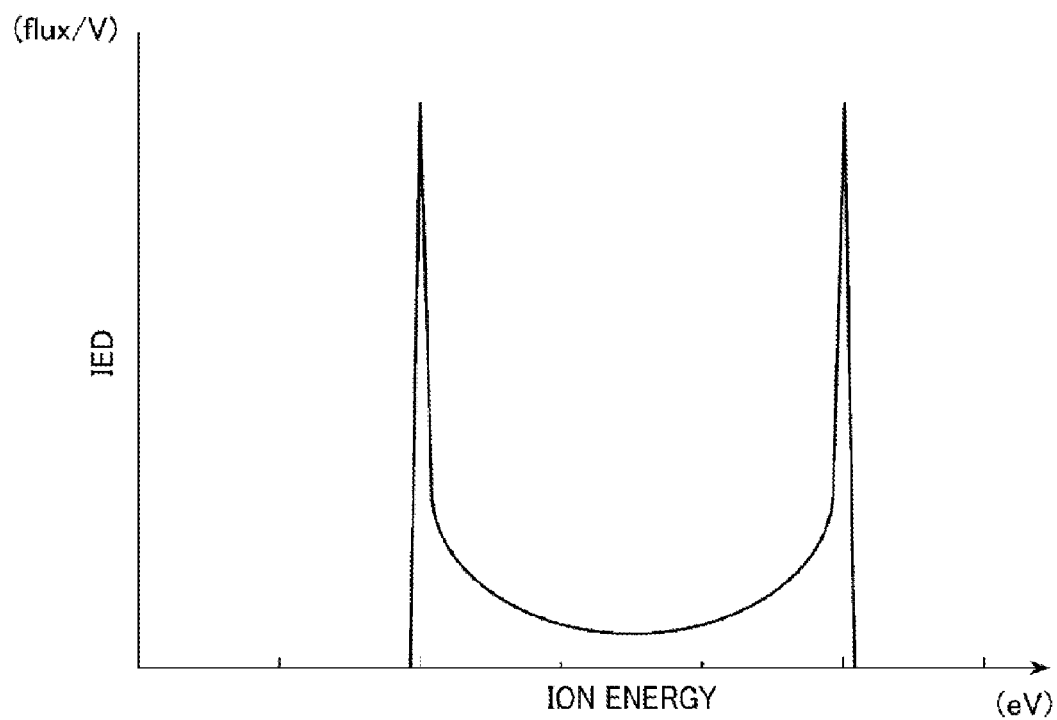
FIG. 9 is a graph for an energy distribution of ions attracted to a susceptor in a conventional substrate processing apparatus.

As illustrated in FIG. 8, the HF high frequency power supply 18 may be connected to the upper electrode plate 30, instead of the susceptor 12, via the HF matching unit 19. The LF high frequency power supply 20 may be connected to the susceptor 12 only via the LF matching unit 21. The DC voltage applying unit 23 may be connected to the suscepter 12 only via the connection changeover switch 47. Accordingly, the low pass filter 22 does not need to be provided so that the electric circuit in the substrate processing apparatus 46 can be simplified.

The illustrative embodiments are described above. However, the illustrative embodiments are not limited thereto.

The object of the illustrative embodiments can also be achieved by supplying a storage medium storing a software program for implementing the function in the aforementioned embodiments to a computer or the like, and by causing a CPU of the computer to read out and execute the program stored in the storage medium.

In such a case, the program itself read out from the storage medium may implement the function of the aforementioned embodiments, and the illustrative embodiments may be embodied by the program and the storage medium storing the program.

If a storage medium for supplying a program can store the above-described program, the storage medium may include, for example, RAM, NV-RAM, a floppy (registered trademark) disk, a hard disk, a magneto-optical disk, an optical disk such as CD-ROM, CD-R, CD-RW, and DVD (DVD-ROM, DVD-RAM, DVD-RW, and DVD+RW), a magnetic tape, a nonvolatile memory card, and other ROMs. Alternatively, the program may be supplied into the computer by downloading it from another computer (not shown) connected to the Internet, a commercial network, a local area network, or database.

Further, The function of each embodiment described above can be implemented by executing the program read by the CPU of the computer, and an OS (operation system) operated on the CPU may perform a part of actual processes in response to instructions of the program, and the function of each embodiment may be implemented by the processes.

Further, the program read from the storage medium may be written in a memory of a function extension board inserted into the computer or a function extension unit connected to the computer, and a CPU of the function extension board or the function extension unit may perform a part or all of the actual process in response to instructions of the program, and the function of each embodiment may be implemented by the process.

The program may include an object code, a program executable by an interpreter, script data supplied to an OS, or the like.

We claim:

1. A connection control method in a substrate processing apparatus comprising: a depressurized processing room; a mounting table that is provided in the processing room and configured to mount a substrate thereon; a first high frequency power supply configured to apply a high frequency voltage for plasma generation; a second high frequency power supply configured to apply a high frequency voltage for bias voltage generation to the mounting table; and a DC voltage applying unit configured to apply a DC voltage of a rectangle-shaped wave to the mounting table, the connection control method comprising:

controlling connection or disconnection, by a first switch that is not connected to a ground but connected to the second high frequency power supply, between the mounting table and the second high frequency power supply and connection or disconnection, by a second switch that applies the DC voltage to the mounting table so as to change an energy distribution of ions attracted to the mounting table, between the mounting table and the DC voltage applying unit when plasma is generated in the processing room.

2. The connection control method of claim 1,
wherein, in the step of controlling, the connection or the disconnection between the mounting table and the second high frequency power supply and the connection or the disconnection between the mounting table and the DC voltage applying unit are controlled individually.

3. The connection control method of claim 2,
wherein, in the step of controlling, the second high frequency power supply is disconnected from the mounting table if the DC voltage applying unit is connected to the mounting table, and the DC voltage applying unit is disconnected from the mounting table if the second high frequency power supply is connected to the mounting table.

* * * * *